US011778847B2

(12) United States Patent
Song et al.

(10) Patent No.: US 11,778,847 B2
(45) Date of Patent: Oct. 3, 2023

(54) DISPLAY PANEL, METHOD FOR MANUFACTURING SAME, AND DISPLAY DEVICE

(71) Applicant: BOE TECHNOLOGY GROUP CO., LTD., Beijing (CN)

(72) Inventors: Youngsuk Song, Beijing (CN); Wei Liu, Beijing (CN); Hongda Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 75 days.

(21) Appl. No.: 17/345,029

(22) Filed: Jun. 11, 2021

(65) Prior Publication Data

US 2022/0093894 A1 Mar. 24, 2022

(30) Foreign Application Priority Data

Sep. 23, 2020 (CN) .......................... 202011011847.1

(51) Int. Cl.
| | | |
|---|---|---|
| H01L 51/52 | (2006.01) | |
| H10K 50/824 | (2023.01) | |
| H10K 59/122 | (2023.01) | |
| H10K 71/00 | (2023.01) | |
| H10K 50/818 | (2023.01) | |
| H10K 50/828 | (2023.01) | |
| H10K 59/12 | (2023.01) | |
| H10K 102/10 | (2023.01) | |
| H10K 102/00 | (2023.01) | |

(52) U.S. Cl.
CPC ......... H10K 50/824 (2023.02); H10K 59/122 (2023.02); H10K 71/00 (2023.02); *H10K 50/818* (2023.02); *H10K 50/828* (2023.02); *H10K 59/1201* (2023.02); *H10K 2102/103* (2023.02); *H10K 2102/3026* (2023.02)

(58) Field of Classification Search
CPC . H01L 51/5218; H01L 51/5228; H01L 51/56; H01L 27/3246
USPC ........................................................... 257/91
See application file for complete search history.

(56) References Cited

U.S. PATENT DOCUMENTS

| | | | |
|---|---|---|---|
| 2014/0239262 A1* | 8/2014 | Kim ..................... | H10K 50/824 257/40 |
| 2016/0126304 A1* | 5/2016 | Cho ..................... | H10K 50/824 438/23 |
| 2017/0133620 A1* | 5/2017 | Lee ........................ | H10K 71/00 |
| 2019/0097161 A1* | 3/2019 | Im .......................... | H10K 71/00 |
| 2021/0233979 A1* | 7/2021 | Ma ..................... | H10K 59/1213 |

* cited by examiner

*Primary Examiner* — Dzung Tran
(74) *Attorney, Agent, or Firm* — Lippes Mathias LLP

(57) ABSTRACT

A display panel includes: a substrate, a pixel-defining layer disposed on the substrate, and a conductive pattern, a light-emitting layer and a cathode layer which are laminated in a direction perpendicular to and away from the substrate. The pixel-defining layer is configured to define a plurality of pixel regions and a non-pixel region outside the pixel regions on the substrate. The conductive pattern includes: an auxiliary electrode layer disposed in the non-pixel region, wherein a groove is formed in a side wall of the auxiliary electrode layer. The cathode layer includes: a first portion disposed in the pixel region and a second portion disposed in the non-pixel region. The second portion of the cathode layer extends into the groove and is in contact with the groove.

18 Claims, 8 Drawing Sheets

DISPLAY PANEL, METHOD FOR MANUFACTURING SAME, AND DISPLAY DEVICE

CROSS REFERENCE TO RELATED APPLICATION

This application claims priority to the Chinese Patent Application No. 202011011847.1, filed on Sep. 23, 2020, and entitled "DISPLAY PANEL, METHOD FOR MANUFACTURING SAME, AND DISPLAY DEVICE", the content of which is incorporated herein by reference in its entirety.

TECHNICAL FIELD

The present disclosure relates to the field of display technologies, and in particular, relate to a display panel, a method for manufacturing the same, and a display device.

BACKGROUND

Currently, an organic light-emitting diode (OLED) display panels generally includes an anode layer, an organic light-emitting layer and a cathode layer. OLED display panels can be classified into bottom emitting OLED display panels and top emitting OLED display panels, based on different light-emitting surfaces. Top emitting OLED display panels can have a big aperture, and have become a research spot in recent years.

SUMMARY

Embodiments of the present disclosure provide a display panel, a method for manufacturing the same, and a display device. The technical solutions are as follows.

In an aspect, a display panel is provided. The display panel includes: a substrate; a pixel-defining layer disposed on the substrate; and a conductive pattern, a light-emitting layer and a cathode layer which are laminated in a direction perpendicular to and away from the substrate, wherein the pixel-defining layer is configured to define a plurality of pixel regions and a non-pixel region outside the pixel regions on the substrate; the conductive pattern includes: an auxiliary electrode layer disposed in the non-pixel region, wherein a grove is in a side wall of the auxiliary electrode layer; and the cathode layer includes: a first portion disposed in the pixel region and a second portion disposed in the non-pixel region, wherein the second portion of the cathode layer extends into the groove and is in contact with the groove.

Optionally, the auxiliary electrode layer includes: a metal electrode and a first protective electrode which are laminated in the direction perpendicular to and away from the substrate, wherein in a direction parallel with the substrate, the first protective electrode is extended over the metal electrode to form the groove, and the second portion of the cathode layer is in contact with a side wall of the metal electrode.

Optionally, the auxiliary electrode layer further includes a second protective electrode disposed at a side of the metal electrode close to the substrate, wherein in the direction parallel with the substrate, the second protective electrode is extended over the metal electrode to form the groove, and the second portion of the cathode layer is in contact with the second protective electrode.

Optionally, a first orthographic projection of the first protective electrode on the substrate is within a second orthographic projection of the second protective electrode on the substrate, and an outer boundary of the first orthographic projection is staggered from an outer boundary of the second orthographic projection.

Optionally, the pixel-defining layer covers an edge area of the second protective electrode.

Optionally, the first orthographic projection is within a central area of the second orthographic projection, and a third orthographic projection of the metal electrode on the substrate is within the central area of the second orthographic projection.

Optionally, a distance between the outer boundary of the first orthographic projection and the outer boundary of the second orthographic projection ranges from 3 to 6 microns.

Optionally, a material of the first protective electrode and a material of the second protective electrode both include indium tin oxide or indium zinc oxide.

Optionally, the conductive pattern further includes an anode layer disposed in the pixel region.

Optionally, the anode layer includes: a first sub-anode, a second sub-anode and a third sub-anode which are laminated in the direction perpendicular to and away from the substrate, wherein when the auxiliary electrode layer includes: a second protective electrode, a metal electrode and a first protective electrode which are laminated in the direction perpendicular to and away from the substrate, a material of the first sub-anode is the same as a material of the first protective electrode, a material of the second sub-anode is the same as a material of the metal electrode, and a material of the third sub-anode is the same as a material of the second protective electrode.

Optionally, the substrate includes: a pixel driving circuit electrically connected to the anode layer and a cathode signal line electrically connected to the auxiliary electrode layer.

Optionally, the display panel further includes an encapsulation layer disposed on a side of the cathode layer away from the substrate.

In another aspect, a method for manufacturing a display panel is provided. The method includes: forming a pixel-defining layer on a substrate, and a conductive pattern, a light-emitting layer and a cathode layer which are laminated in a direction perpendicular to and away from the substrate, wherein the pixel-defining layer is configured to define a plurality of pixel regions and a non-pixel region outside the pixel regions on the substrate; the conductive pattern includes: an auxiliary electrode layer disposed in the non-pixel region, wherein a groove is formed in a side wall of the auxiliary electrode layer; and the cathode layer includes: a first portion disposed in the pixel region and a second portion disposed in the non-pixel region, wherein the second portion of the cathode layer extends into the groove and is in contact with the groove.

Optionally, forming the pixel-defining layer on the substrate, and the conductive pattern, the light-emitting layer and the cathode layer which are laminated in the direction perpendicular to and away from the substrate includes: forming the conductive pattern on the substrate, wherein the conductive pattern includes an anode layer and the auxiliary electrode layer; forming the pixel-defining layer on the conductive pattern; forming the light-emitting layer on the pixel-defining layer; and forming the cathode layer on the light-emitting layer.

Optionally, forming the conductive pattern on the substrate includes: forming a first sub-conductive pattern on the substrate, wherein the first sub-conductive pattern includes a first sub-anode disposed in the pixel region and a second protective electrode disposed in the non-pixel region; and forming a second sub-conductive pattern on the first sub-conductive pattern, wherein the second sub-conductive pattern includes: a second sub-anode and a third sub-anode which are laminated in the direction perpendicular to and away from the substrate on the first sub-anode and, and a metal electrode and a first protective electrode which are laminated in the direction perpendicular to and away from the substrate on the second protective electrode, wherein in a direction parallel with the substrate, the first protective electrode and the second protective electrode are both extended over the metal electrode.

Optionally, forming the cathode layer on the light-emitting layer includes: forming the cathode layer on the light-emitting layer by a sputtering process, wherein a second portion of the cathode layer is in contact with the second protective electrode and a side wall of the metal electrode.

Optionally, a first orthographic projection of the first protective electrode on the substrate is within a second orthographic projection of the second protective electrode on the substrate, and an outer boundary of the first orthographic projection is staggered from an outer boundary of the second orthographic projection.

Optionally, the first orthographic projection is within a central area of the second orthographic projection, and a third orthographic projection of the metal electrode on the substrate is within the central area of the second orthographic projection.

Optionally, after forming the cathode layer on the light-emitting layer, the method further includes: forming an encapsulation layer on the cathode layer.

In yet another aspect, a display device is provided. The display device includes: a power supply component and a display panel, wherein the power supply component is configured to supply power to the display panel, and the display panel includes: a substrate;

a pixel-defining layer disposed on the substrate, and a conductive pattern, a light-emitting layer and a cathode layer which are laminated in a direction perpendicular to and away from the substrate, wherein the pixel-defining layer is configured to define a plurality of pixel regions and a non-pixel region outside the pixel regions on the substrate; the conductive pattern includes: an auxiliary electrode layer disposed in the non-pixel region, wherein a groove is formed in a side wall of the auxiliary electrode layer; and the cathode layer includes: a first portion disposed in the pixel region and a second portion disposed in the non-pixel region, wherein the second portion of the cathode layer extends into the groove and is in contact with the groove.

BRIEF DESCRIPTION OF THE DRAWINGS

For clearer descriptions of the technical solutions in the embodiments of the present disclosure, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

The embodiments of the present disclosure will be described below with reference to the accompanying drawings.

For a top-emitting OLED display panel, a thin and transparent cathode layer and an anode layer capable of reflecting light are required, in order to increase light transmittance. While, the thin and transparent cathode layer usually suffers from problems such as high resistance and serious voltage drop (IR drop). Generally, the farther a position in the cathode layer is from a power supply point, the voltage drop at the position is more significant, which leads to obvious uneven light emission in the OLED display panel.

Currently, an auxiliary electrode, an organic light-emitting layer, and a cathode layer may be sequentially formed during forming an OLED display panel. The auxiliary electrode is electrically connected to the cathode layer, and a power supply may provide electrical signals to the auxiliary electrode. By means of the auxiliary electrode, the voltage at various positions in the cathode layer can be made the same, thereby overcoming the problem of serious voltage drop in the cathode layer in the OLED display panel.

However, the organic light-emitting layer is usually formed by an evaporation process. During the formation of the organic light-emitting layer by the evaporation process, the organic light-emitting layer is easily attached to the auxiliary electrode, to affect the electrical connection between the auxiliary electrode and the cathode layer formed subsequently, which leads to a poor display effect of the OLED display panel.

Figure 1:
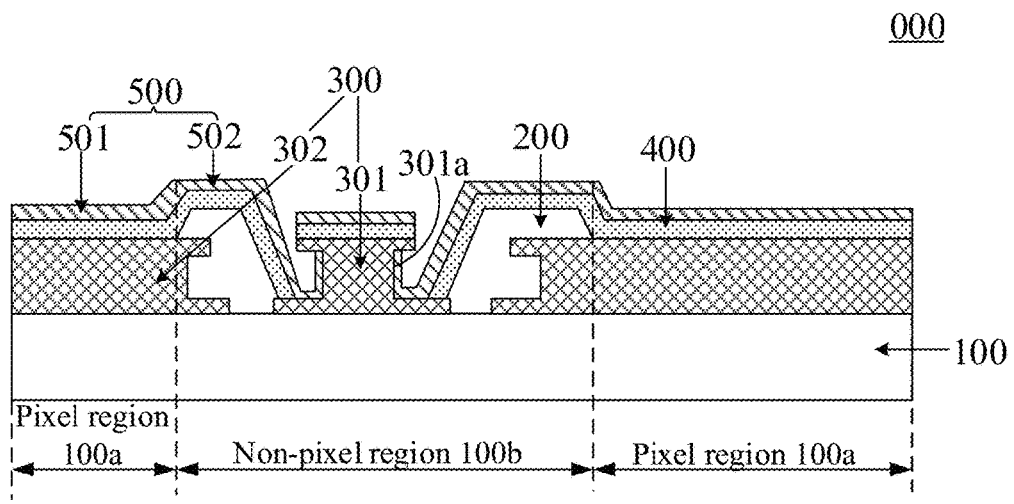
FIG. 1 is a schematic diagram of a film layer structure of a display panel according to an embodiment of the present disclosure.

Referring to FIG. 1, it is a schematic diagram of a film layer structure of a display panel according to an embodiment of the present disclosure. The display panel 000 may include: a substrate 100, a pixel-defining layer 200 disposed on the substrate 100, and a conductive pattern 300, a light-emitting layer 400 and a cathode layer 500 which are laminated in a direction perpendicular to and away from the substrate 100.

The pixel-defining layer 200 on the substrate 100 is configured to define a plurality of pixel regions 100a and a non-pixel region 100b outside the pixel regions 100a, on the substrate 100.

The conductive pattern 300 on the substrate 100 may include: an auxiliary electrode layer 301 disposed in the non-display area 100b. A groove 301a is in a side wall of the auxiliary electrode layer 301. It should be noted that the auxiliary electrode layer 301 has an upper surface and a lower surface which are parallel to the substrate 100, and the side wall of the auxiliary electrode layer 301 is disposed between the upper surface and the lower surface and is connected to the upper surface and the lower surface. In the present disclosure, a groove 301a is in the side wall of the auxiliary electrode layer 301. Therefore, when the light-emitting layer 400 is formed on the conductive pattern 300 by the evaporation process, the broken line phenomenon occurs in the area, where the auxiliary electrode layer 301 is disposed, of the light-emitting layer 400. That is, the portion of the light-emitting layer 400 disposed on the auxiliary electrode layer 301 is disconnected from other portions of the light-emitting layer 400.

The cathode layer 500 on the substrate 100 includes: a first portion 501 disposed in the pixel region 100a, and a second portion 502 disposed in the non-pixel region 100b. The second portion 502 of the cathode layer 500 may extend into the groove 301a in the side wall of the auxiliary electrode layer 301, and is contact with the groove 301a.

In the embodiment of the present disclosure, when the light-emitting layer 400 is formed on the conductive pattern 300, the broken line phenomenon occurs in the area, where the auxiliary electrode layer 301 is disposed, of the light-emitting layer 400, and a groove 301a is in the side wall of the auxiliary electrode layer 301. Therefore, the second portion 502 of the cathode layer 500 on the light-emitting layer 400 may extend into the groove 301a in the side wall of the auxiliary electrode layer 301 and is contact with the groove 301a, such that effective overlapping between the cathode layer 500 and the auxiliary electrode layer 301 is realized.

In summary, the display panel provided by the embodiment of the present disclosure includes a substrate, a pixel-defining layer disposed on the substrate, and a conductive pattern, a light-emitting layer and a cathode layer which are laminated in a direction perpendicular to and away from the substrate. When the light-emitting layer is formed on the conductive pattern, the broken line phenomenon occurs in the area, where the auxiliary electrode layer is disposed, of the light-emitting layer, and a groove is formed in the side wall of the auxiliary electrode layer. Therefore, when the cathode layer is formed on the light-emitting layer, the second portion of the cathode layer may extend into the groove in the side wall of the auxiliary electrode layer, and is contact with the groove 301a, such that effective overlapping between the cathode layer and the auxiliary electrode layer is realized. Thus, the light-emitting layer is prevented from being attached to the auxiliary electrode layer to lead to failure of normal overlapping between the cathode layer and the auxiliary electrode layer. Therefore, the electrical connection performance between the cathode layer and the auxiliary electrode layer is effectively improved, and the display panel has a good display effect.

In the embodiment of the present disclosure, the display panel 000 may further include: an anode layer. As an example, the anode layer may be disposed in the conductive pattern 300. In this case, as shown in FIG. 1, the conductive pattern 300 may further include: an anode layer 302 disposed in the pixel region 100a. As such, the anode layer 302 and the auxiliary electrode layer 301 may be made of the same conductive layer. That is, the anode layer 302 and the auxiliary electrode layer 301 are formed by the same patterning process.

In the present disclosure, the anode layer 302, the first portion 501 of the cathode layer 500 and the portion of the light-emitting layer 400 disposed in the pixel region 100a may form a light-emitting device. It should be noted that, in the embodiment of the present disclosure, there are a plurality of light-emitting devices in the display panel 100. The plurality of light-emitting devices may be in one-to-one correspondence with the plurality of pixel regions 100a, and each light-emitting device may be disposed in a corresponding pixel region 100a.

For example, the light-emitting device may be an OLED light-emitting device, which may be a top-emitting light-emitting device. In this case, the anode layer 302 in the light-emitting device has reflective property, and the cathode layer 500 in the light-emitting device may be a thin and transparent cathode layer 500. As the thin and transparent cathode layer 500 has problems such as high resistance and serious voltage drop, the cathode layer 500 needs to be overlapped with the auxiliary electrode layer 301 having a small resistance value. By means of the auxiliary electrode layer 301, the voltage at various positions in the cathode layer 500 is made the same, thereby improving the display effect of the display panel.

Figure 2:
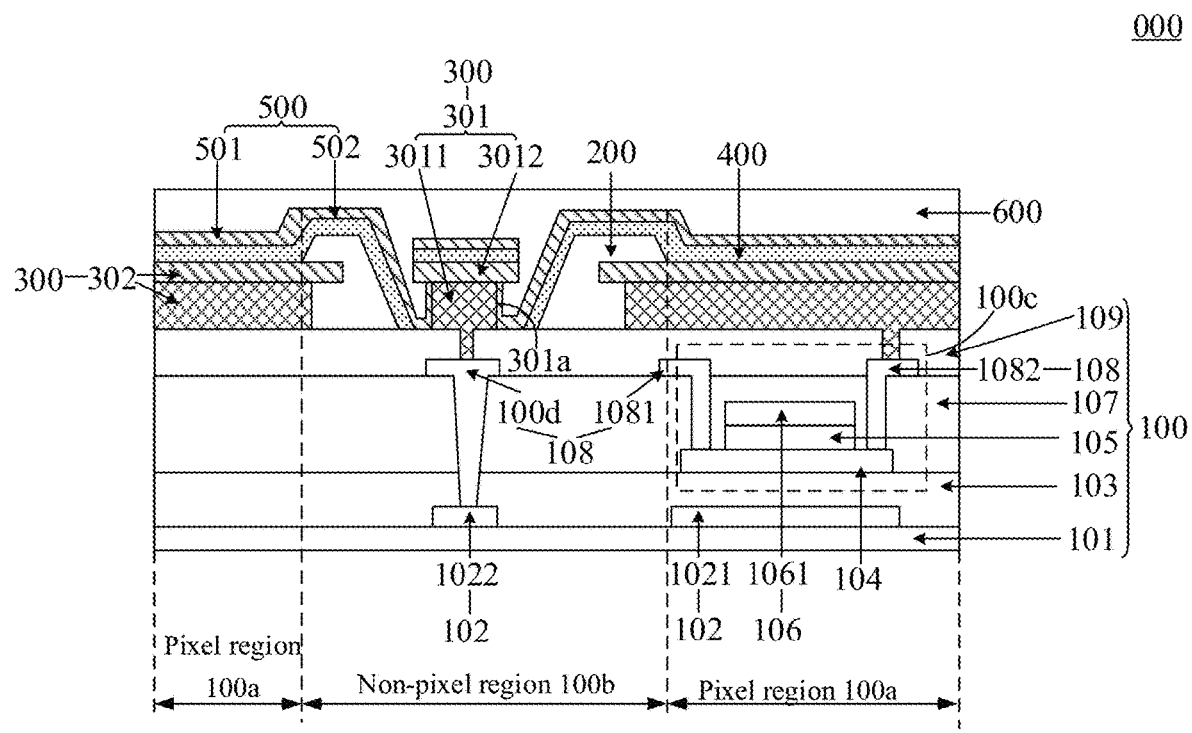
FIG. 2 is a schematic diagram of a film layer structure of another display panel according to an embodiment of the present disclosure.

Optionally, referring to FIG. 2, it is a schematic diagram of a film layer structure of another display panel according to an embodiment of the present disclosure. The auxiliary electrode layer 301 in the display panel 000 may include: a metal electrode 3011 and a first protective electrode 3012 which are laminated in a direction perpendicular to and away from the substrate 100.

In the auxiliary electrode layer 301, the first protective electrode 3012 is extended over the metal electrode 3011 in the direction parallel to the substrate 100. As such, the portion, being extended over the metal electrode 3011, of the first protective electrode 3012, the substrate 100 and the metal electrode 3011 may form the groove 301a in the side wall of the auxiliary electrode layer 301. The second portion 502 of the cathode layer 500 in the display panel 000 may be in contact with the side wall of the metal electrode 3011.

In the present disclosure, when the light-emitting layer 400 is formed on the auxiliary electrode layer 301, the light-emitting layer 400 may be attached to the side, away from the substrate 100, of the first protective electrode 3012 in the auxiliary electrode layer 301. Since in the auxiliary electrode layer 301, the first protective electrode 3012 is extended over the metal electrode 3011 in the direction parallel to the substrate 100, the light-emitting layer 400 is not attached to the side wall of the metal electrode 3011, such that the second portion 502 of the cathode layer 500 may be in contact with the side wall of the metal electrode 3011. In addition, as the metal electrode 3011 usually has a small resistance value, when the second portion 502 of the cathode layer 500 is in contact with the side wall of the metal electrode 3011, the voltage at various positions in the cathode layer 500 may be made the same by means of the metal electrode 3011.

In the embodiment of the present disclosure, when the cathode layer 500 is only in contact with the side wall of the metal electrode 3011 in the auxiliary electrode layer 301, the overlapping area between the cathode layer 500 and the auxiliary electrode layer 301 is small. Therefore, the electrical connection performance between the cathode layer 500 and the auxiliary electrode layer 301 may be affected.

Figure 3:
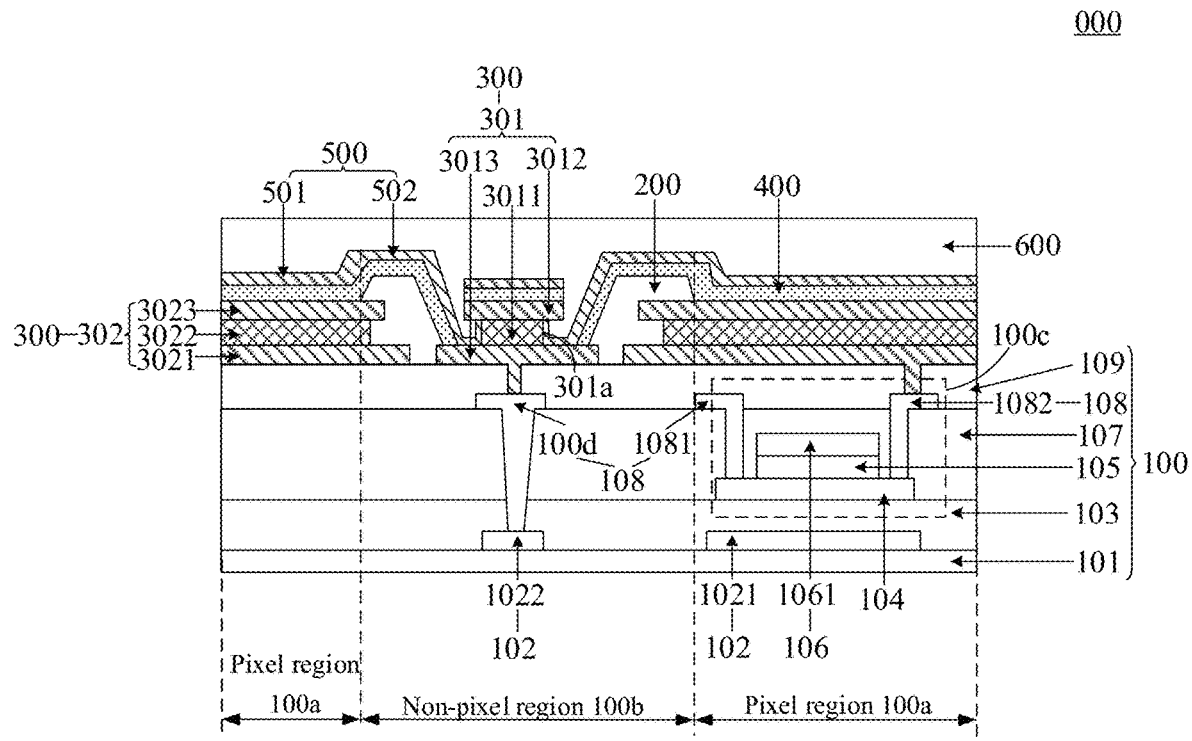
FIG. 3 is a schematic diagram of a film layer structure of yet another display panel according to an embodiment of the present disclosure.

Referring to FIG. 3, it is a schematic diagram of a film layer structure of yet another display panel according to an embodiment of the present disclosure. Based on the structure of the display panel 000 shown in FIG. 2, the auxiliary electrode layer 301 in the display panel 000 may further include: a second protective electrode 3013 disposed on a side of the metal electrode 3011 close to the substrate 100.

In the auxiliary electrode layer 301, the second protective electrode 3013 is extended over the metal electrode 3011 in the direction parallel to the substrate 100. As such, the portion, being extended over the metal electrode 3011, of the second protective electrode 3013, the portion, being extended over the metal electrode 3011, of the first protective electrode 3012, and the metal electrode 3011 may form the groove 301a in the side wall of the auxiliary electrode layer 301. The second portion 502 of the cathode layer 500 in the display panel 000 may be in contact with the second protective electrode 3013.

In the present disclosure, since in the auxiliary electrode layer 301, the second protective electrode 3013 is extended over the metal electrode 3011 in the direction parallel to the substrate 100, the second portion 502 of the cathode layer 500 may be in contact with both the side wall of the metal electrode 3011 and the second protective electrode 3013. Therefore, an overlapping area between the cathode layer 500 and the auxiliary electrode layer 301 is effectively increased, thereby improving the electrical connection performance between the cathode layer 500 and the auxiliary electrode layer 301.

Optionally, as shown in FIG. 3, in the auxiliary electrode layer 301, a first orthographic projection of the first protective electrode 3012 on the substrate 100 may be within a second orthographic projection of the second protective electrode 3013 on the substrate 100. Moreover, an outer boundary of the first orthographic projection is staggered from an outer boundary of the second orthographic projection. In this case, the area of the second orthographic projection of the second protective electrode 3013 on the substrate 100 is greater than the area of the first orthographic projection of the first protective electrode 3012 on the substrate 100. Therefore, when the second portion 502 of the cathode layer 500 is in contact with the second protective electrode 3013, the overlapping area between the second portion 502 of the cathode layer 500 and the auxiliary electrode layer 301 may be further increased, thereby further improving the electrical connection performance between the cathode layer 500 and the auxiliary electrode layer 301.

Moreover, in the present disclosure, when the area of the second orthographic projection of the second protective electrode 3013 on the substrate 100 is greater than the area of the first orthographic projection of the first protective electrode 3012 on the substrate 100, the pixel-defining layer 200 in the display panel 000 may be in contact with an edge area of the second protective electrode 3013, such that the light-emitting layer 400 in the display panel 000 may be effectively prevented from being thermalized, thereby prolonging the service life of the light-emitting device in the display panel 000.

In the embodiment of the present disclosure, as shown in FIG. 3, in the auxiliary electrode layer 301, the first orthographic projection of the first protective electrode 3012 on the substrate 100 may be disposed within a central area of the second orthographic projection of the second protective electrode 3013 on the substrate 100.

As an example, a distance between the boundary of the second orthographic projection of the second protective electrode 3013 on the substrate 100 and the boundary of the first orthographic projection of the first protective electrode 3012 on the substrate 100 ranges from 3 to 6 microns.

In the present disclosure, as shown in FIG. 3, in the auxiliary electrode layer 301, a third orthographic projection of the metal electrode 3011 on the substrate 100 may also be disposed within the central area of the second orthographic projection of the second protective electrode 3013 on the substrate 100.

Optionally, as shown in FIG. 3, in the auxiliary electrode layer 301, both the first protective electrode 3012 and the second protective electrode 3013 may be transparent electrodes. For example, the materials of both the first protective electrode 3012 and the second protective electrode 3013 may include: indium tin oxide (ITO) or indium zinc oxide (IZO). The metal electrode 3011 may be a reflective electrode. For example, the material of the metal electrode 3011 may include a metallic material such as metallic aluminum, metallic molybdenum, metallic silver, or an alloy.

In the embodiment of the present disclosure, the anode layer 302 in the conductive pattern 300 and the auxiliary electrode layer 301 may be manufactured from the same conductive layer. Therefore, as shown in FIG. 3, the anode layer 302 may include: a first sub-anode 3021, a second sub-anode 3022 and a third sub-anode 3023 which are laminated in the direction perpendicular to and away from the substrate 100. The first sub-anode 3021 may be made of the same material as the second protective electrode 3013 in the auxiliary electrode layer 301, so that the first sub-anode 3021 and the second protective electrode 3013 are disposed in the same sub-conductive pattern. The second sub-anode 3022 may be made of the same material as the metal electrode 3011 in the auxiliary electrode layer 301, so that the second sub-anode 3022 and the metal electrode 3011 are disposed in the same sub-conductive pattern. The third sub-anode 3023 may be made of the same material as the first protective electrode 3012 in the auxiliary electrode layer 301, so that the third sub-anode 3023 and the first protective electrode 3012 are disposed in the same sub-conductive pattern.

Therefore, in the anode layer 302, the second sub-anode 3022 is made of a metal having a reflective property, and the anode layer 302 is an anode layer having a reflective property. Moreover, in the anode layer 302, when the materials of the first sub-anode 3021 and the third sub-anode 3023 disposed on two sides of the second sub-anode 3022 include ITO or IZO, the work function of the second sub-anode 3022 having the reflective property may be improved by means of ITO or IZO, which is conducive to the improvement of the electrical performance of the anode layer 302.

It should be noted that, since in the auxiliary electrode layer 301, the area of the second orthographic projection of the second protective electrode 3013 on the substrate 100 is greater than the area of the first orthographic projection of the first protective electrode 3012 on the substrate 100, at least two patterning processes are needed to form the anode layer 302 and the auxiliary electrode layer 301. That is, the conductive pattern 300 in the display panel 000 is formed by at least two patterning processes. As an example, a sub-conductive pattern including the first sub-anode 3021 and the second protective electrode 3013 may be formed by one patterning process, and a sub-conductive pattern including the second sub-anode 3022 and the metal electrode 3011, and a sub-conductive pattern including the third sub-anode 3023 and the first protective electrode 3012 may be formed by another patterning process.

Optionally, as shown in FIG. 2 or FIG. 3, the substrate 100 in the display panel 000 may include: a pixel region circuit 100c electrically connected to the anode layer 302 in the conductive pattern 300, and a cathode signal line 100d electrically connected to the auxiliary electrode layer 301 in the conductive pattern 300. The pixel driving circuit pixel 100c is configured to apply a drive voltage to the anode layer 302, and the cathode signal line 100d is configured to apply a cathode voltage to the cathode layer 500 via the auxiliary electrode layer 301. For example, the cathode voltage has a voltage value of 0. In the present disclosure, when the drive voltage is applied to the anode layer 302 and the cathode voltage is applied to the cathode layer 500, the light-emitting layer 400 disposed between the anode layer 302 and the first portion 501 of the cathode layer 500 may emit light.

As an example, the substrate 100 may include: a base 101, and a first conductive pattern 102, a buffer layer 103, an active layer pattern 104, a gate insulating layer 105, a second conductive pattern 106, an interlayer dielectric layer 107, a third conductive pattern 108 and a planarization layer 109 which are laminated on the base 101 in a direction perpendicular to and away from the base 101.

The first conductive pattern 102 may include: a light-shielding layer 1021 and a connecting electrode 1022. The light-shielding layer 1021 is configured to shield the active layer pattern 104, so as to prevent the active layer pattern 104 from voltage threshold deviation under the irradiation of light. The connecting electrode 1022 is configured to be electrically connected to the cathode signal line 100d, and the connecting electrode 1022 may be electrically connected to a cathode power terminal. In this case, by the connecting electrode 1022, the cathode signal line 100d and the auxiliary electrode layer 301, the voltage on the cathode power terminal may be applied to the cathode layer 103.

The buffer layer 103 is configured to block ions in the base 101 from entering the active layer pattern 104, thereby preventing the performance of the active layer pattern 104 from being affected by the ions entering the active layer pattern 104.

The second conductive pattern 106 may include: a gate 1061 and a gate line (not shown in FIG. 2 and FIG. 3) connected to the gate 1061. The gate line is configured to apply a gate voltage to the gate 1061.

The third conductive pattern 108 may include: a source 1081, a drain 1082, a cathode signal line 100d, and a data line (not shown in FIG. 2 and FIG. 3). The data line may be electrically connected to one of the source 1081 and the drain 1082, and the other of the source 1081 and the drain 1082 may be electrically connected to the anode layer 302. In the present disclosure, the drain 1082 may be electrically connected to the anode layer 302, and the source 1082 needs to be electrically connected to the data line.

It should be noted that structures such as the gate 1061, the active layer pattern 104, the source 1081 and the drain 1082 may form the pixel driving circuit 100c in the above-mentioned embodiment.

Figure 4:
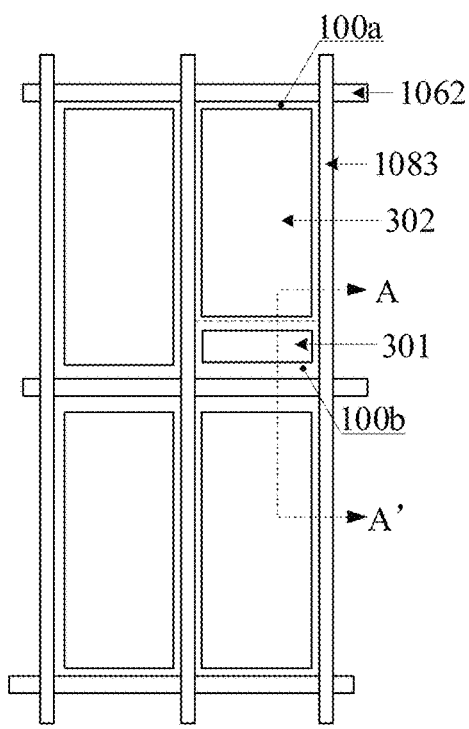
FIG. 4 is a top view of a display panel according to an embodiment of the present disclosure.

Optionally, referring to FIG. 4, it is a top view of a display panel according to an embodiment of the present disclosure. In FIG. 4, for the cross-sectional view of the display panel 000 at A-A', reference may be made to the schematic diagram of the film layer structure of the display panel shown in FIG. 2 or FIG. 3. An extension direction of the gate line 1062 in the display panel 000 may be perpendicular to an extension direction of the data line 1083.

In the embodiment of the present disclosure, there are a plurality of auxiliary electrode layers 301 of the display panel 000 disposed in the non-pixel region 100b outside the pixel regions 100a. The number and arrangement of the auxiliary electrode layers 301 in the display panel 000 may be determined based on the resistance of the cathode layer 500. For example, one auxiliary electrode layer 301 may be provided among every 2×2 pixels; or, one auxiliary electrode layer 301 may be provided among every 3×3 pixels.

Optionally, as shown in FIG. 2 and FIG. 3, the display panel 000 may further include: an encapsulation layer 600 disposed on a side of the cathode layer 500 away from the substrate 100. The encapsulation layer 600 is configured to encapsulate the light-emitting device in the display panel 000, to isolate the light-emitting device from outside air, thereby preventing the light-emitting layer 400 from being corroded by components such as moisture and oxygen in the air.

In summary, the display panel provided by the embodiment of the present disclosure includes a substrate, a pixel-defining layer disposed on the substrate, and a conductive pattern, a light-emitting layer and a cathode layer which are laminated in a direction perpendicular to and away from the substrate. When the light-emitting layer is formed on the conductive pattern, the broken line phenomenon occurs in the area, where the auxiliary electrode layer is disposed, of the light-emitting layer, and a groove is formed in the side wall of the auxiliary electrode layer. Therefore, when the cathode layer is formed on the light-emitting layer, the second portion of the cathode layer extends into the groove in the side wall of the auxiliary electrode layer, and is in contact with the groove, such that effective overlapping between the cathode layer and the auxiliary electrode layer is realized. Thus, the light-emitting layer is prevented from being attached to the auxiliary electrode layer to lead to failure of normal overlapping between the cathode layer and the auxiliary electrode layer. Therefore, the electrical connection performance between the cathode layer and the auxiliary electrode layer is effectively improved, and the display panel has a good display effect.

An embodiment of the present disclosure further provides a method for manufacturing a display panel. The method for manufacturing a display panel is applied to manufacture the display panel shown in FIG. 1. The method may include: forming a pixel-defining layer on a substrate, and a conductive pattern, a light-emitting layer and a cathode layer which are laminated in a direction perpendicular to and away from the substrate.

The pixel-defining layer is configured to define a plurality of pixel regions and a non-pixel region outside the pixel regions on the substrate.

The conductive pattern includes: an auxiliary electrode layer disposed in the non-pixel region, and a groove is formed in a side wall of the auxiliary electrode layer.

The cathode layer includes: a first portion disposed in the pixel region and a second portion disposed in the non-pixel region. The second portion of the cathode layer extends into the groove and is in contact with the groove.

In summary, the method for manufacturing a display panel provided by the embodiment of the present disclosure includes forming a pixel-defining layer on a substrate, and a conductive pattern, a light-emitting layer and a cathode layer which are laminated in a direction perpendicular to and away from the substrate. When the light-emitting layer is formed on the conductive pattern, the broken line phenomenon occurs in the area, where the auxiliary electrode layer is disposed, of the light-emitting layer, and a groove is formed in the side wall of the auxiliary electrode layer. Therefore, when the cathode layer is formed on the light-emitting layer, the second portion of the cathode layer may extend into the groove in the side wall of the auxiliary electrode layer and is in contact with the groove, such that effective overlapping between the cathode layer and the auxiliary electrode layer is realized. Thus, the light-emitting layer is prevented from being attached to the auxiliary electrode layer, to lead to failure of normal overlapping between the cathode layer and the auxiliary electrode layer. Therefore, the electrical connection performance between the cathode layer and the auxiliary electrode layer is effectively improved, and the display panel has a good display effect.

Figure 5:
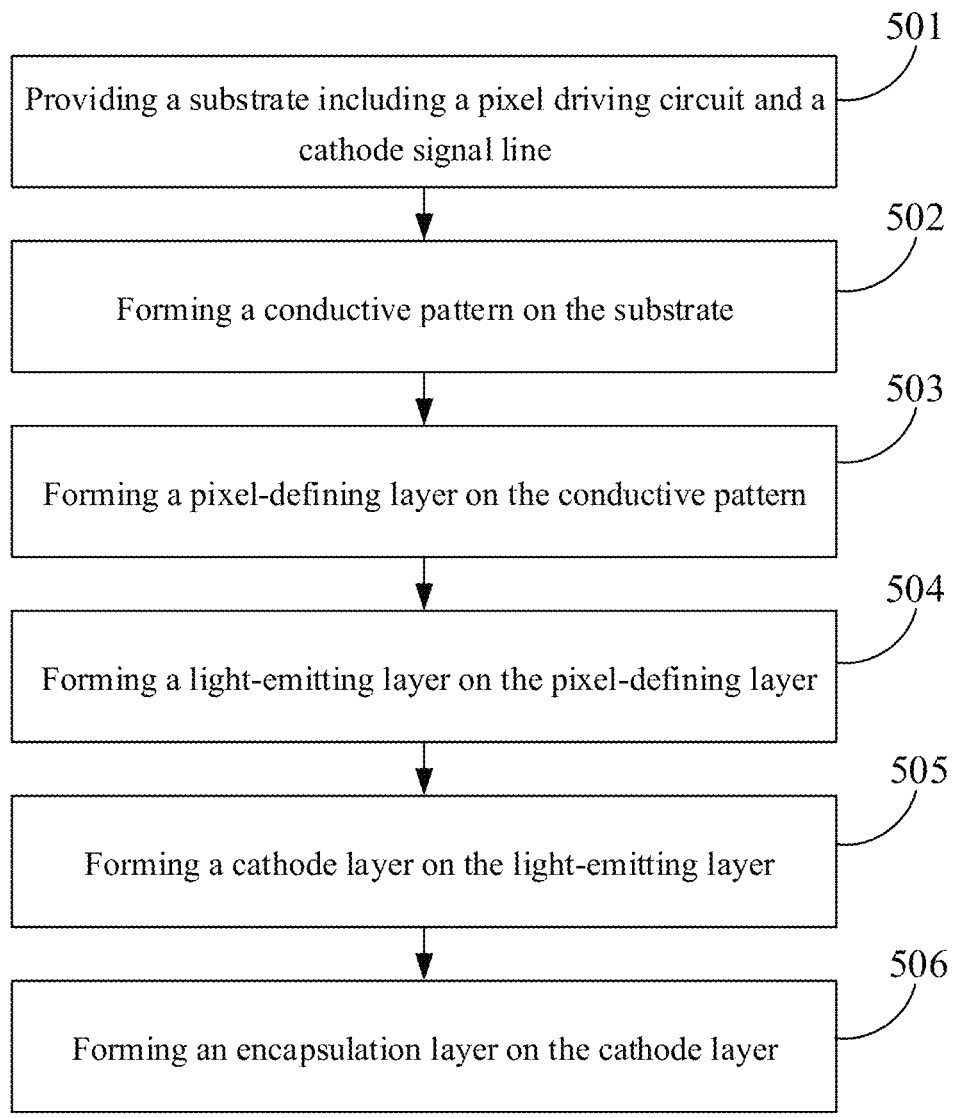
FIG. 5 is a flowchart of a method for manufacturing a display panel according to an embodiment of the present disclosure.

Referring to FIG. 5, it is a flowchart of a method for manufacturing a display panel according to an embodiment of the present disclosure. The method for manufacturing the display panel is applied to manufacture the display panel 000 shown in FIG. 3. The method may include the following steps.

In step 501, a substrate including a pixel driving circuit and a cathode signal line is provided.

Figure 6:
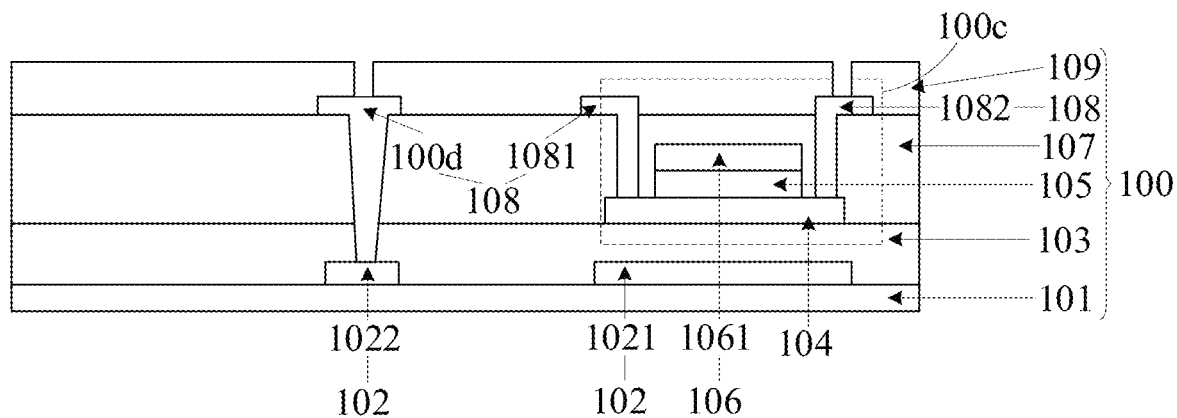
FIG. 6 is a schematic diagram of a film layer structure of a substrate according to an embodiment of the present disclosure.

In an embodiment of the present disclosure, the substrate may include a pixel driving circuit and a cathode signal line. As an example, referring to FIG. 6, it is a schematic diagram of a film layer structure of a substrate according to an embodiment of the present disclosure. The substrate 100 may include: a base 101, and a first conductive pattern 102, a buffer layer 103, an active layer pattern 104, a gate insulating layer 105, a second conductive pattern 106, an interlayer dielectric layer 107, a third conductive pattern 108 and a planarization layer 109 which are laminated on the base 101 in a direction perpendicular to and away from the base 101.

In the present disclosure, providing the substrate including the pixel driving circuit and the cathode signal line may include the following procedures.

First, a first conductive layer is formed on the base 101, and a one-time patterning process is performed on the first conductive layer to form a first conductive pattern 102. The first conductive pattern 102 may include: a light-shielding layer 1021 and a connecting electrode 1022. Optionally, the material of the first conductive pattern 102 may include a metallic material such as metallic aluminum, metallic silver, metallic molybdenum, or an alloy.

Next, a buffer layer 102 is formed on the base 101 on which the first conductive pattern 102 is formed. Optionally, the material of the buffer layer 102 may include an inorganic material such as silicon nitride, silicon oxide, or silicon oxynitride. In the present disclosure, the thickness of the buffer layer 102 ranges from 0.6 microns to 3 microns.

Afterwards, an active material film is formed on the base 101 on which the buffer layer 102 is formed, and an active layer pattern 104 is formed by performing the one-time patterning process on the active material film. Optionally, the material of the active layer pattern 104 may include a semiconductor material such as polysilicon, amorphous silicon, or an oxide semiconductor.

Afterwards, a gate insulating film and a second conductive layer are formed on the base 101 on which the active layer pattern 104 is formed, and a gate insulating layer 105 and a second conductive pattern 106 are formed by performing the one-time patterning process on the second conductive layer. The second conductive pattern 106 may include: a gate 1061 and a gate line (not shown in FIG. 6) connected to the gate 1061. Optionally, the material of the second conductive pattern 106 may include a metallic material such as metallic aluminum, metallic silver, metallic molybdenum, or an alloy.

Afterwards, an interlayer dielectric film is formed on the base 101 on which the second conductive pattern 106 is formed, and an interlayer dielectric layer 107 is formed by performing the one-time patterning process on the interlayer dielectric film. Optionally, the material of the interlayer dielectric layer 107 may include: silicon dioxide, silicon nitride, or a mixed material of silicon dioxide and silicon nitride.

Afterwards, a third conductive layer is formed on the base 101 on which the interlayer dielectric layer 107 is formed, and a third conductive pattern 108 is formed by performing the one-time patterning process on the third conductive layer. The third conductive pattern 108 may include: a source 1081, a drain 1082, a cathode signal line 100*d*, and a data line (not shown in FIG. 6). Optionally, the material of the third conductive pattern 108 may include a metallic material such as metallic aluminum, metallic silver, metallic molybdenum or an alloy. Structures such as the gate 1061, the active layer pattern 104, the source 1081 and the drain 1082 may form the pixel driving circuit 100*c* in the above-mentioned embodiment.

Finally, a planarization film may be formed on the base 101 on which the third conductive pattern 108 is formed, and a planarization layer 109 is formed by performing the one-time patterning process on the planarization film.

It should be noted that the substrate 100 including the pixel driving circuit 100*c* and the cathode signal line 100*d* may be formed through the above-mentioned procedures. It should also be noted that the one-time patterning process in the above-mentioned embodiment may include: photoresist coating, exposure, developing, etching, and photoresist stripping.

In step 502, a conductive pattern is formed on the substrate.

In the embodiment of the present disclosure, the conductive pattern may include: an anode layer and an auxiliary electrode layer. As an example, forming the conductive pattern on the substrate may include the following steps.

In step 5021, a first sub-conductive pattern is formed on the substrate.

Figure 7:
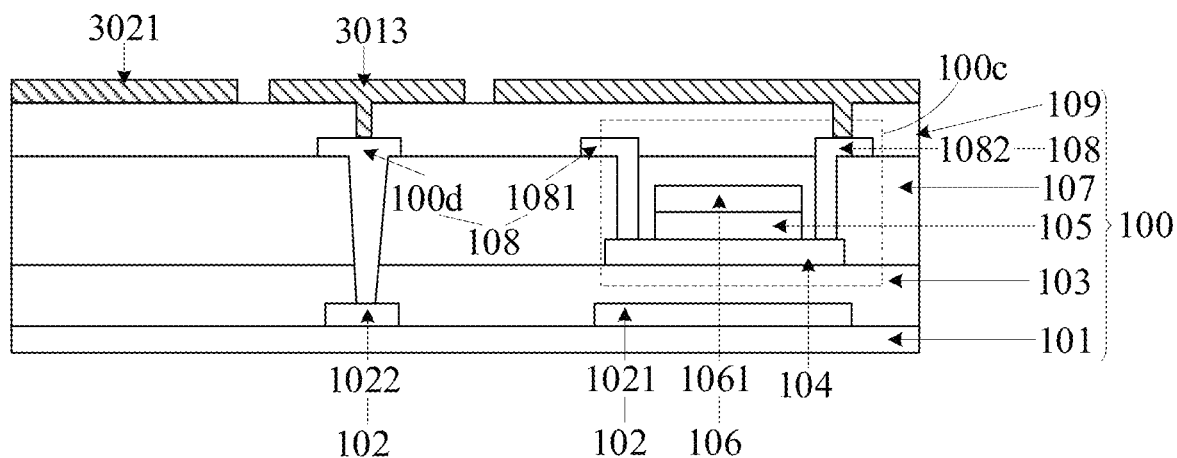
FIG. 7 is a schematic diagram illustrating formation of a first sub-conductive pattern on a substrate according to an embodiment of the present disclosure.

As shown in FIG. 7, it is a schematic diagram illustrating the formation of the first sub-conductive pattern on the substrate according to the embodiment of the present disclosure. The first sub-conductive pattern may include: a first sub-anode 3021 disposed in the pixel region and a second protective electrode 3013 disposed in the non-pixel region. The first sub-anode 3021 may be electrically connected to the pixel driving circuit 100*c* in the substrate 100. For example, the first sub-anode 3021 may be electrically connected to the drain 1082 in the pixel driving circuit 100*c*.

The second protective electrode 3013 may be electrically connected to the cathode signal line 100*d* in the substrate 100.

Optionally, the material of the first sub-conductive pattern includes: a transparent conductive material such as ITO or IZO.

As an example, forming the first sub-conductive pattern on the substrate may include: forming a first sub-conductive film on the substrate 100, and performing a one-time patterning process on the first sub-conductive film to form the first sub-conductive pattern. The one-time patterning process may include: photoresist coating, exposure, developing, etching, and photoresist stripping.

In step 5022, a second sub-conductive pattern is formed on the first sub-conductive pattern.

Figure 8:
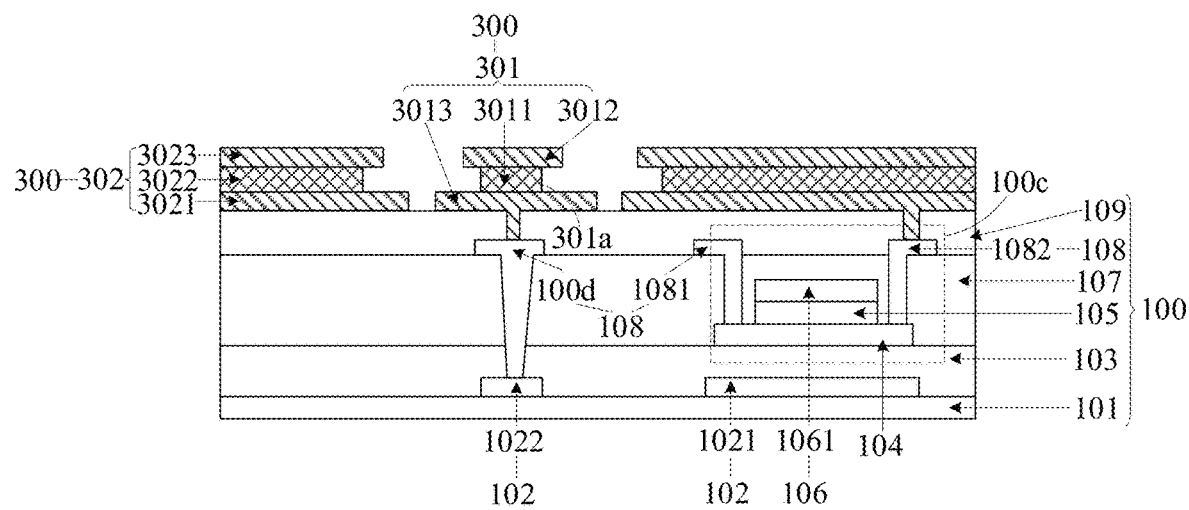
FIG. 8 is a schematic diagram illustrating formation of a second sub-conductive pattern on a first sub-conductive pattern according to an embodiment of the present disclosure.

Referring to FIG. 8, it is a schematic diagram illustrating the formation of the second sub-conductive pattern on the first sub-conductive pattern according to an embodiment of the present disclosure. The second sub-conductive pattern may include: a second sub-anode 3022 and a third sub-anode 3023 which are laminated on the first sub-anode 3021 in a direction perpendicular to and away from the substrate 100, as well as a metal electrode 3011 and a first protective electrode 3012 which are laminated on the second protective electrode 3013 in the direction perpendicular to and away from the substrate 100. The first protective electrode 3012 and the second protective electrode 3013 are both extended over the metal electrode 3011 in the direction parallel to the substrate 100. As such, the portion, extended over the metal electrode 3011, of the second protective electrode 3013, the portion, extended over the metal electrode 3011, of the first protective electrode 3012, and the metal electrode 3011 may form the groove 301*a* in the side wall of the auxiliary electrode layer 301.

In the present disclosure, the first sub-anode 3021, the second sub-anode 3022, and the third sub-anode 3023 which are laminated may form the anode layer 302, and the second protective electrode 3013, the metal electrode 3011, and the first protective electrode 3012 which are laminated may form the auxiliary electrode layer 301.

As an example, forming the second sub-conductive pattern on the first sub-conductive pattern may include the following steps.

In step A, a second sub-conductive film and a third sub-conductive film are sequentially formed on the substrate on which the first sub-conductive pattern is formed.

Optionally, the material of the second sub-conductive film may include a metallic material such as metallic aluminum, metallic molybdenum, metallic silver or an alloy. The material of the third sub-conductive film may include a transparent conductive material such as ITO or IZO.

Figure 9:
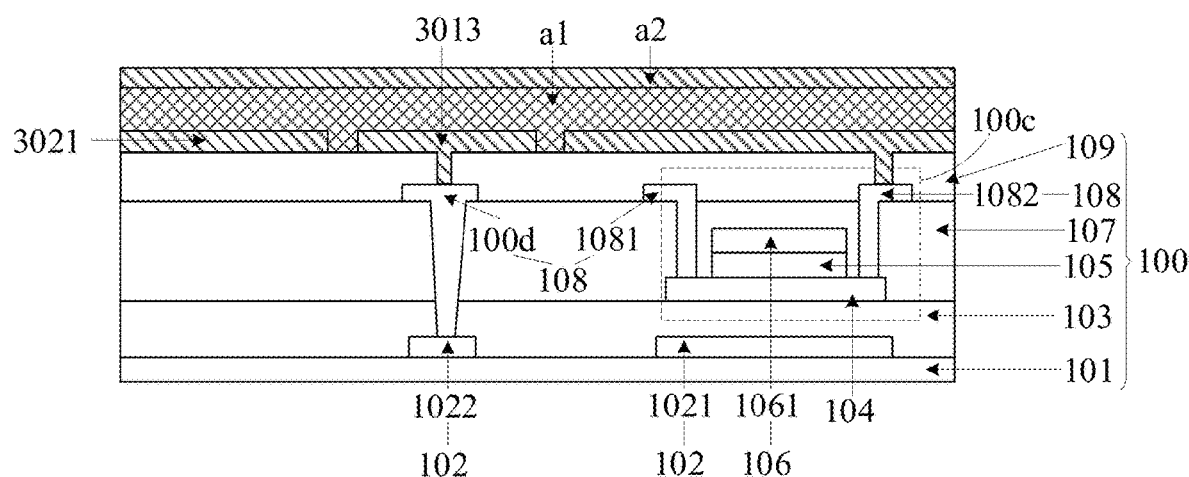
FIG. 9 is a schematic diagram illustrating formation of a second sub-conductive film and a third sub-conductive film sequentially on a substrate on which a first sub-conductive pattern is formed according to an embodiment of the present disclosure.

Referring to FIG. 9, it is a schematic diagram illustrating the formation of the second sub-conductive film and the third sub-conductive film sequentially on the substrate on which the first sub-conductive pattern is formed according to an embodiment of the present disclosure. The second sub-conductive film a1 and the third sub-conductive film a2 may be sequentially formed on the substrate 100 on which the first sub-conductive pattern is formed, by any of deposition, coating, sputtering and the like.

In step B, a photoresist pattern is formed on the third sub-conductive film.

Figure 10:
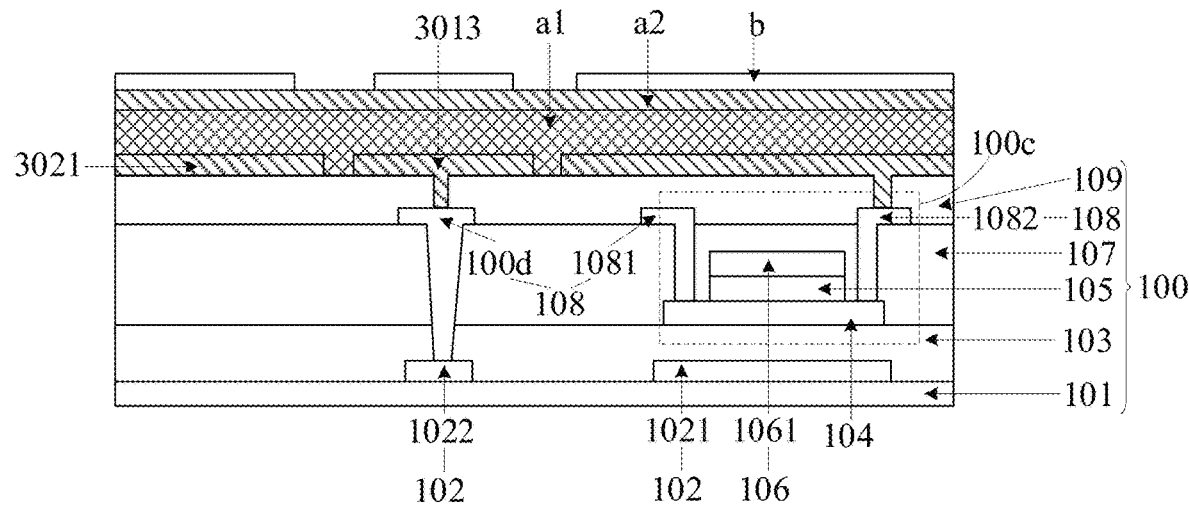
FIG. 10 is a schematic diagram illustrating formation of a photoresist pattern on a third sub-conductive film according to an embodiment of the present disclosure.

Referring to FIG. 10, it is a schematic diagram illustrating the formation of the photoresist pattern on the third sub-conductive film according to an embodiment of the present disclosure. A layer of photoresist film may be coated on the third sub-conductive film a2, and then exposure and developing are performed on the photoresist film to form a photoresist pattern b on the third sub-conductive film a2.

In step C, an etching process may be performed on the third sub-conductive to film the third sub-anode and the first protective electrode.

Figure 11:
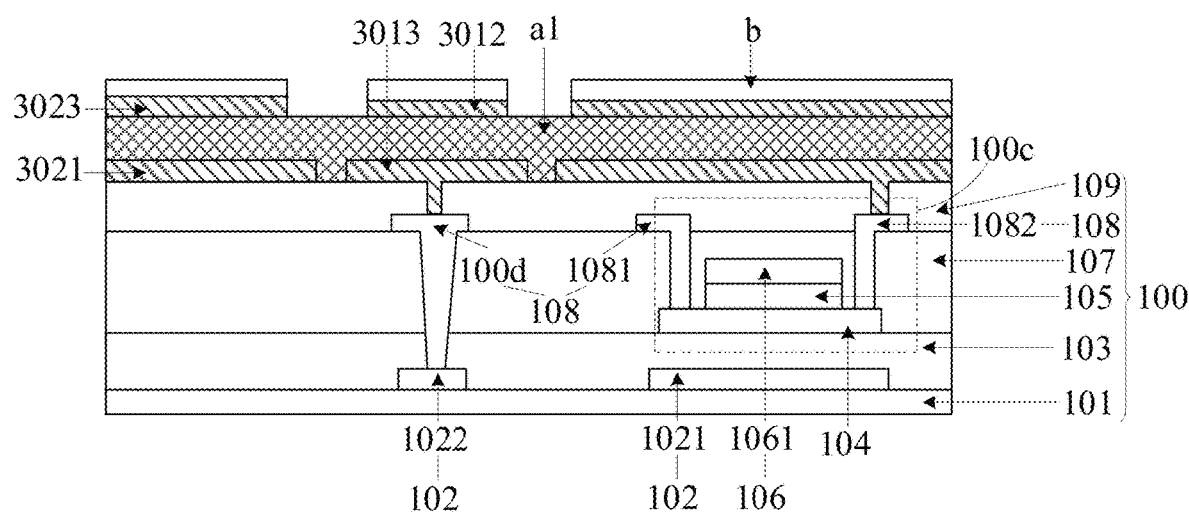
FIG. 11 is a schematic diagram illustrating formation of a third sub-anode and a first protective electrode according to an embodiment of the present disclosure.

Referring to FIG. 11, it is a schematic diagram illustrating the formation of the third sub-anode and the first protective electrode according to an embodiment of the present disclosure. A sub-conductive pattern including the third sub-anode 3023 and the first protective electrode 3012 may be formed by performing the etching process on the third sub-conductive film including the photoresist pattern b.

As an example, an etching solution for etching a transparent conductive material may be used to perform the etching process on the third sub-conductive film, to remove portions, not covered by the photoresist pattern b, of the third sub-conductive film, thereby forming the sub-conductive pattern including the third sub-anode 3023 and the first protective electrode 3012.

The boundary of the orthographic projection of the conductive pattern including the third sub-anode 3023 and the first protective electrode 3012 on the substrate 100 coincides with the boundary of the orthographic projection of the photoresist pattern b on the substrate 100.

In step D, a second sub-anode and a metal electrode are formed by performing an over-etching process on the second sub-conductive film.

Figure 12:
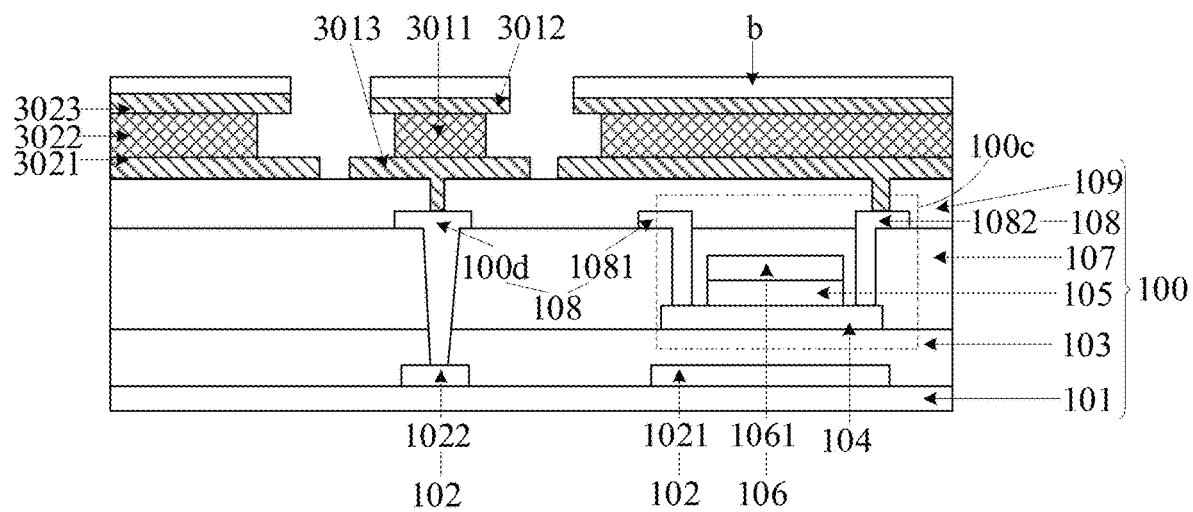
FIG. 12 is a schematic diagram illustrating formation of a second sub-anode and a metal electrode according to an embodiment of the present disclosure.

Referring to FIG. 12, it is a schematic diagram illustrating the formation of the second sub-anode and the metal electrode according to an embodiment of the present disclosure. A conductive pattern including the second sub-anode 3022 and the metal electrode 3011 may be formed by performing the over-etching process on the second sub-conductive film including the third sub-anode 3023 and the first protective electrode 3012.

In an exemplary embodiment, an etching solution for etching a metallic material may be used for etching the second sub-conductive film, to remove areas that are not covered by the third sub-anode 3023 and the first protective electrode 3012. Afterwards, the etching duration may be increased properly to implement the over-etching process on the second sub-conductive film, so as to form the conductive pattern including the second sub-anode 3022 and the metal electrode 3011. In this way, the first protective electrode 3012 and the second protective electrode 3013 are both extended over the metal electrode 3011 in the direction parallel to the substrate 100.

In step E, a second sub-conductive pattern is formed on the first sub-conductive pattern by stripping off the photoresist pattern.

In the present disclosure, the photoresist pattern may be stripped off to form the second sub-conductive pattern on the first sub-conductive pattern. Reference may be made to the schematic diagram shown in FIG. 8 for the first conductive pattern and the second conductive pattern. The first sub-conductive pattern and the second sub-conductive pattern together constitute the anode layer 302 and the auxiliary electrode layer 301 in the display panel.

It should be noted that the conductive pattern 300 including the anode layer 302 and the auxiliary electrode layer 301 may be formed on the substrate through the above-mentioned steps 5021 to 5022.

Moreover, in the auxiliary electrode layer 301, the first orthographic projection of the first protective electrode 3012 on the substrate 100 is within the second orthographic projection of the second protective electrode 3013 on the substrate 100, and the outer boundary of the first orthographic projection is staggered from the outer boundary of the second orthographic projection. The first orthographic projection is in the central area of the second orthographic projection, and the third orthographic projection of the metal electrode 3011 on the substrate 100 is in the central area of the second orthographic projection.

In step 503, a pixel-defining layer is formed on the conductive pattern.

Optionally, the material of the pixel-defining layer may include at least one of: polymers based on polymethyl methacrylate and polystyrene, polymers and derivatives based on phenol group, polymers based on acrylic, polymers based on p-xylene, polymers based on aryl ether, polymers based on amide, polymers based on fluoride, and polymers based on vinyl alcohol.

Figure 13:
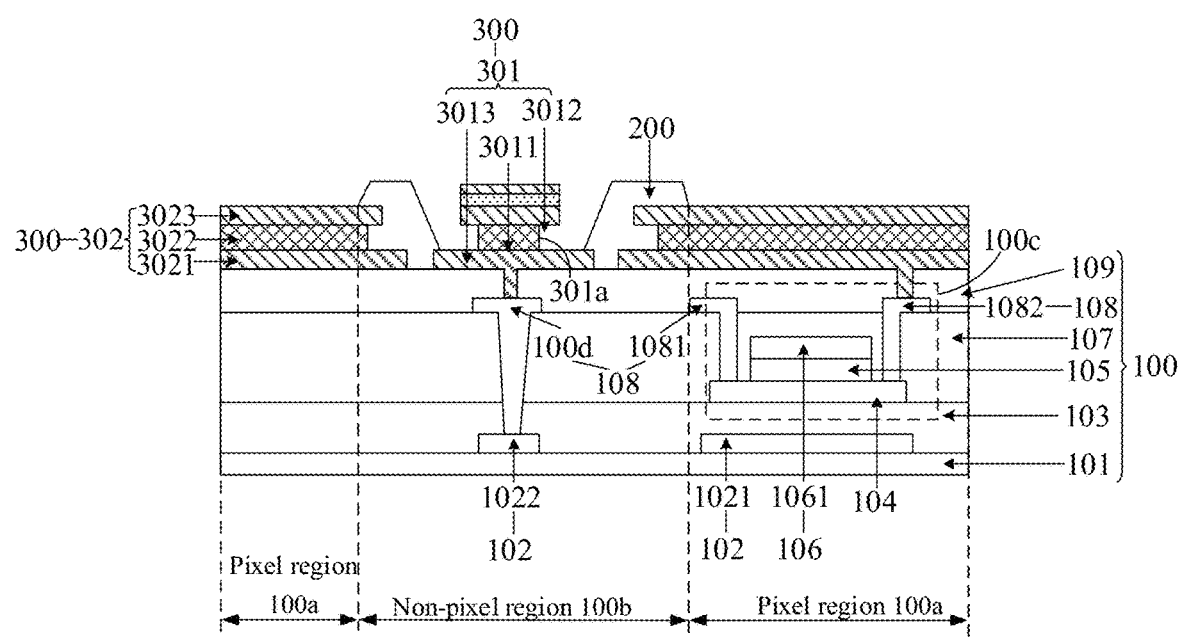
FIG. 13 is a schematic diagram illustrating formation of a pixel-defining layer on a conductive pattern according to an embodiment of the present disclosure.

Referring to FIG. 13, it is a schematic diagram illustrating the formation of the pixel-defining layer on the conductive pattern according to an embodiment of the present disclosure. A pixel-defining film may be formed on the substrate 100 on which the conductive pattern is formed, by any of deposition, coating, sputtering and the like, and then the pixel-defining layer 200 is formed by performing the one-time patterning process on the pixel-defining film. The one-time patterning process may include: photoresist coating, exposure, developing, etching, and photoresist stripping.

The pixel-defining layer 200 is configured to define a plurality pixel regions 100a and a non-pixel region 100b outside the pixel regions 100a on the substrate 100. The anode layer 302 in the conductive pattern 300 may be disposed in the pixel region 100a, and the auxiliary electrode layer 301 in the conductive pattern 300 may be disposed in the non-pixel region 100b.

In step 504, a light-emitting layer is formed on the pixel-defining layer.

Optionally, the material of the light-emitting layer may include a phosphorescent or fluorescent light-emitting material.

Figure 14:
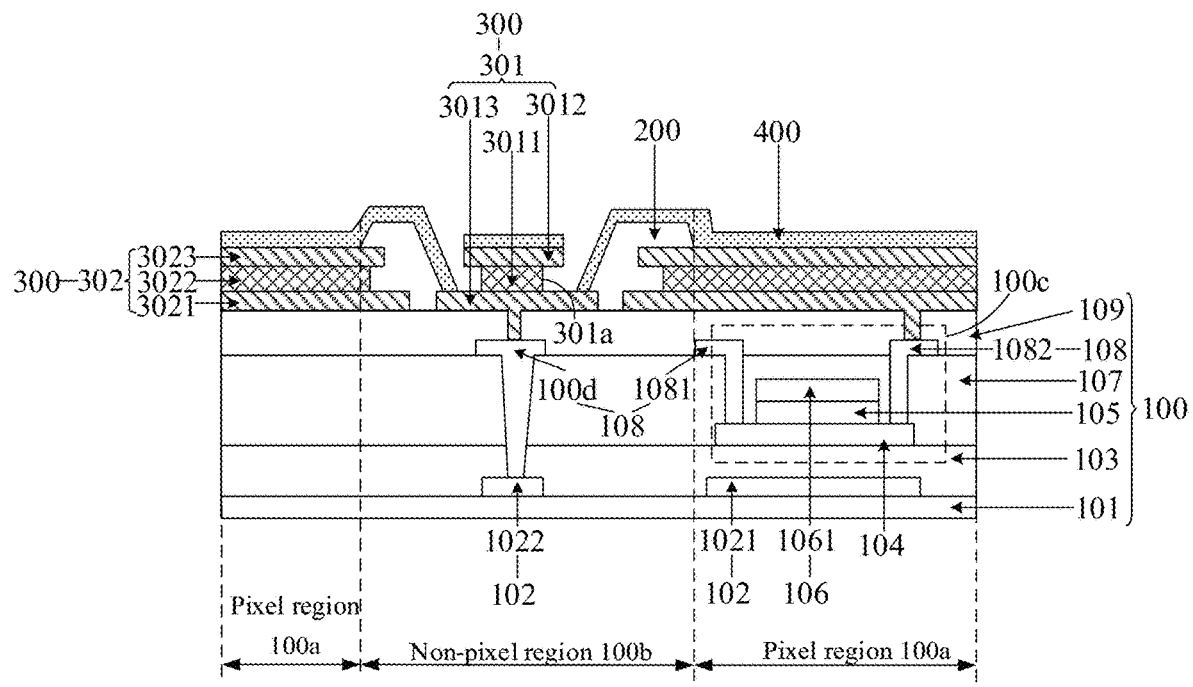
FIG. 14 is a schematic diagram illustrating formation of a light-emitting layer on a pixel defining layer according to an embodiment of the present disclosure.

Referring to FIG. 14, it is a schematic diagram illustrating the formation of the light-emitting layer on the pixel-defining layer according to an embodiment of the present disclosure. The light-emitting layer 400 may be formed by evaporation on the substrate 100 on which the pixel-defining layer 200 is formed.

In the present disclosure, a groove 301a is in the side wall of the auxiliary electrode layer 301. Therefore, when the light-emitting layer 400 is formed on the conductive pattern 300 by evaporation, the broken line phenomenon occurs in the area, where the auxiliary electrode layer 301 is disposed, of the light-emitting layer 400. That is, the portion of the light-emitting layer 400 disposed on the auxiliary electrode layer 301 is disconnected from other portions of the light-emitting layer 400.

In step 505, a cathode layer is formed on the light-emitting layer.

Optionally, the material of the cathode layer may include: ITO or IZO.

Figure 15:
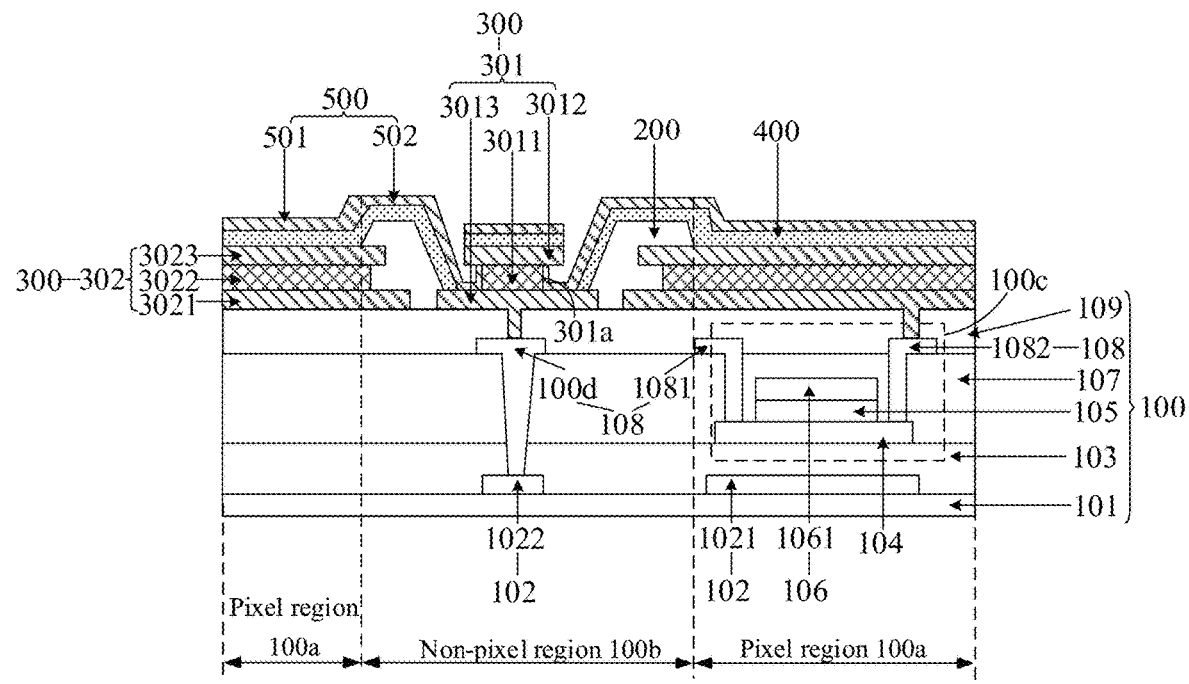
FIG. 15 is a schematic diagram illustrating formation of a cathode layer on a light-emitting layer according to an embodiment of the present disclosure.

Referring to FIG. 15, it is a schematic diagram illustrating the formation of the cathode layer on the light-emitting layer according to an embodiment of the present disclosure. The cathode layer 500 may be formed by sputtering on the substrate 100 on which the light-emitting layer 400 is formed. The cathode layer 500 may include: a first portion 501 disposed in the pixel region 100a, and a second portion 502 disposed in the non-pixel region 100b. The second portion 502 of the cathode layer 500 is in contact with the second protective electrode 3013 in the auxiliary electrode layer 301, and is in contact with the side wall of the metal electrode 3011 in the auxiliary electrode layer 301.

In the present disclosure, the film layer formed by sputtering has better diffusibility. Therefore, when the cathode layer 500 is formed by sputtering, the second portion 502 of the cathode layer 500 may be in contact with the side wall of the metal electrode 3011.

In the present disclosure, the anode layer 302, the first portion 501 of the cathode layer 500 and the portion of the light-emitting layer 400 disposed in the pixel region 100a may constitute a light-emitting device. It should be noted that, in the embodiments of the present disclosure, there are a plurality of light-emitting devices in the display panel 100. The plurality of light-emitting devices may be in one-to-one correspondence with the plurality of pixel regions 100a, and each light-emitting device may be disposed in a corresponding pixel region 100a.

In step 506, an encapsulation layer is formed on the cathode layer.

In the embodiment of the present disclosure, the display panel shown in FIG. 3 can be acquired after the encapsulation layer 600 is formed on the cathode layer 500. As an example, the encapsulation layer 600 may be formed on the cathode layer 500 by deposition.

Persons skilled in the art can clearly understand that for the convenience and brevity of description, for the working principle and connection relation of respective structures in the display panel described above, reference may be made to the corresponding content in the forgoing embodiments of the structure of the display panel, and details are not repeated herein.

In summary, the method for manufacturing a display panel provided by the embodiment of the present disclosure includes forming a pixel-defining layer on a substrate, and a conductive pattern, a light-emitting layer and a cathode layer which are laminated in a direction perpendicular to and away from the substrate. When the light-emitting layer is formed on the conductive pattern, the broken line phenomenon occurs in the area, where the auxiliary electrode layer is disposed, of the light-emitting layer, and a groove is formed in the side wall of the auxiliary electrode layer. Therefore, when the cathode layer is formed on the light-emitting layer, the second portion of the cathode layer may be extended into the groove in the side wall of the auxiliary electrode layer and is in contact with the groove, such that effective overlapping between the cathode layer and the auxiliary electrode layer is realized. Thus, the light-emitting layer is prevented from being attached to the auxiliary electrode layer to lead to failure of normal overlapping between the cathode layer and the auxiliary electrode layer. Therefore, the electrical connection performance between the cathode layer and the auxiliary electrode layer is effectively improved, and the display panel has a good display effect.

An embodiment of the present disclosure further provides a display device. The display device may include: a power supply component and a display panel. The display panel may include: a substrate; a pixel-defining layer disposed on the substrate, and a conductive pattern, a light-emitting layer and a cathode layer which are laminated in a direction perpendicular to and away from the substrate.

The pixel-defining layer is configured to define a plurality of pixel regions and a non-pixel region outside the pixel regions on the substrate. The conductive pattern includes: an auxiliary electrode layer disposed in the non-pixel region, and a groove is formed in a side wall of the auxiliary electrode layer. The cathode layer includes: a first portion disposed in the pixel region and a second portion disposed in the non-pixel region. The second portion of the cathode layer extends into the groove and is in contact with the groove.

As an example, the display panel may be the display panel shown in any one of FIG. 1, FIG. 2 and FIG. 3. The display device may be any product or component having a display function, such as a piece of electronic paper, a mobile phone, a tablet computer, a television, a display, a notebook computer, a digital photo frame, a navigator, or the like.

It should be noted that in the accompanying drawings, the size of the layers and regions may be exaggerated for clearer illustration. In addition, it is to be understood that when an element or a layer is described as being "on" another element or layer, the element or layer may be directly on another element or layer, or there may be an intermediate layer. In addition, it is to be understood that when an element or a layer is described as being "under" another element or layer, the element or layer may be directly under another element or layer, or there may be more than one intermediate layer or element. In addition, it is to be further understood that when a layer or an element is described as being "between" two layers or elements, the layer or element may be the only one layer between the two layers or elements, or there may be more than one intermediate layer or element. Similar reference numerals indicate similar elements throughout the specification.

In the present disclosure, the terms "first" and "second" are merely intended for description, but are not intended to indicate or imply relative importance. The term "a plurality of" refers to two or more than two, unless otherwise clearly specified.

Described above are merely optional embodiments of the present disclosure, but are not intended to limit the present disclosure. Any modifications, equivalent replacements, improvements and the like made within the spirit and principles of the present disclosure shall be included within the scope of protection of the present disclosure.

What is claimed is:

1. A display panel, comprising:
   a substrate;
   a pixel-defining layer disposed on the substrate; and
   a conductive pattern, a light-emitting layer and a cathode layer which are laminated in a direction perpendicular to and away from the substrate,
   wherein the pixel-defining layer is configured to define a plurality of pixel regions and a non-pixel region outside the pixel regions on the substrate;
   the conductive pattern comprises: an auxiliary electrode layer disposed in the non-pixel region, wherein a groove is formed in a side wall of the auxiliary electrode layer; and
   the cathode layer comprises: a first portion disposed in the pixel region and a second portion disposed in the non-pixel region, wherein the second portion of the cathode layer extends into the groove and is in contact with the groove; and
   wherein,
   the auxiliary electrode layer comprises a metal electrode and a first protective electrode which are laminated in the direction perpendicular to the substrate, and the first protective electrode is disposed at a side away from the substrate of the metal electrode; and in a direction parallel with the substrate, the first protective electrode is extended over the metal electrode to form the groove and the second portion of the cathode layer is in contact with a side wall of the metal electrode; and
   the auxiliary electrode layer further comprises a second protective electrode disposed at a side of the metal electrode closer to the substrate; in the direction parallel with the substrate, the second protective electrode is extended over the metal electrode to form the groove, and the second portion of the cathode layer is disposed in the groove and is in contact with the second protective electrode.

2. The display panel according to claim 1, wherein a first orthographic projection of the first protective electrode on the substrate is within a second orthographic projection of the second protective electrode on the substrate, and an outer boundary of the first orthographic projection is staggered from an outer boundary of the second orthographic projection.

3. The display panel according to claim 2, wherein the pixel-defining layer covers an edge area of the second protective electrode.

4. The display panel according to claim 2, wherein the first orthographic projection is within a central area of the second orthographic projection, and a third orthographic projection of the metal electrode on the substrate is within the central area of the second orthographic projection.

5. The display panel according to claim 2, wherein a distance between the outer boundary of the first orthographic projection and the outer boundary of the second orthographic projection ranges from 3 to 6 microns.

6. The display panel according to claim 1, wherein a material of the first protective electrode and a material of the second protective electrode both comprise indium tin oxide or indium zinc oxide.

7. The display panel according to claim 1, wherein the conductive pattern further comprises an anode layer disposed in the pixel region.

8. The display panel according to claim 7, wherein the anode layer comprises: a first sub-anode, a second sub-anode and a third sub-anode which are laminated in the direction perpendicular to and away from the substrate;
   wherein a material of the first sub-anode is the same as a material of the first protective electrode, a material of the second sub-anode is the same as a material of the metal electrode, and a material of the third sub-anode is the same as a material of the second protective electrode.

9. The display panel according to claim 7, wherein the substrate comprises: a pixel driving circuit electrically connected to the anode layer, and a cathode signal line electrically connected to the auxiliary electrode layer.

10. The display panel according to claim 9, further comprising: an encapsulation layer disposed on a side of the cathode layer away from the substrate.

11. A method for manufacturing a display panel, comprising:
    forming a pixel-defining layer on a substrate, and a conductive pattern, a light-emitting layer and a cathode layer which are laminated in a direction perpendicular to and away from the substrate,
    wherein the pixel-defining layer is configured to define a plurality of pixel regions and a non-pixel region outside the pixel regions on the substrate; the conductive pattern comprises: an auxiliary electrode layer disposed in the non-pixel region, wherein a groove is formed in a side wall of the auxiliary electrode layer; and the cathode layer comprises: a first portion disposed in the pixel region and a second portion disposed in the non-pixel region, wherein the second portion of the cathode layer extends into the groove and is in contact with the groove; and wherein, the auxiliary electrode layer comprises a metal electrode and a first protective electrode which are laminated in the direction perpendicular to the substrate, and the first protective electrode is disposed at a side away from the substrate of the metal electrode; and in a direction parallel with the substrate, the first protective electrode is extended over the metal electrode to form the groove and the second portion of the cathode layer is in contact with a side wall of the metal electrode; and the auxiliary electrode layer further comprises a second protective electrode disposed at a side of the metal electrode closer to the substrate; in the direction parallel with the substrate, the second protective electrode is extended over the metal electrode to form the groove, and the second portion of the cathode layer is disposed in the groove and is in contact with the second protective electrode.

12. The method according to claim 11, wherein forming the pixel-defining layer on the substrate, and the conductive pattern, the light-emitting layer and the cathode layer which are laminated in the direction perpendicular to and away from the substrate comprises:

forming the conductive pattern on the substrate, the conductive pattern comprising an anode layer and the auxiliary electrode layer;

forming the pixel-defining layer on the conductive pattern;

forming the light-emitting layer on the pixel-defining layer; and forming the cathode layer on the light-emitting layer.

13. The method according to claim 12, wherein forming the conductive pattern on the substrate comprises:

forming a first sub-conductive pattern on the substrate, wherein the first sub-conductive pattern comprises a first sub-anode disposed in the pixel region and the second protective electrode disposed in the non-pixel region; and forming a second sub-conductive pattern on the first sub-conductive pattern, wherein the second sub-conductive pattern comprises: a second sub-anode and a third sub-anode which are laminated on the first sub-anode in the direction perpendicular to and away from the substrate, wherein in a direction parallel with the substrate, the first protective electrode and the second protective electrode are both extended over the metal electrode.

14. The method according to claim 13, wherein forming the cathode layer on the light-emitting layer comprises:

forming the cathode layer on the light-emitting layer by a sputtering process.

15. The method according to claim 13, wherein a first orthographic projection of the first protective electrode on the substrate is within a second orthographic projection of the second protective electrode on the substrate, and an outer boundary of the first orthographic projection is staggered from an outer boundary of the second orthographic projection.

16. The method according to claim 15, wherein the first orthographic projection is within a central area of the second orthographic projection, and a third orthographic projection of the metal electrode on the substrate is within the central area of the second orthographic projection.

17. The method according to claim 12, wherein after forming the cathode layer on the light-emitting layer, the method further comprises:

forming an encapsulation layer on the cathode layer.

18. A display device, comprising a power supply component and a display panel, wherein the power supply component is configured to supply power to the display panel, and the display panel comprises:

a substrate;

a pixel-defining layer disposed on the substrate; and a conductive pattern, a light-emitting layer and a cathode layer which are laminated in a direction perpendicular to and away from the substrate, wherein the pixel-defining layer is configured to define a plurality of pixel regions and a non-pixel region outside the pixel regions on the substrate;

the conductive pattern comprises: an auxiliary electrode layer disposed in the non-pixel region, wherein a groove is formed in a side wall of the auxiliary electrode layer; and the cathode layer comprises: a first portion disposed in the pixel region and a second portion disposed in the non-pixel region, wherein the second portion of the cathode layer extends into the groove and is in contact with the groove; and wherein, the auxiliary electrode layer comprises a metal electrode and a first protective electrode which are laminated in the direction perpendicular to the substrate, and the first protective electrode is disposed at a side away from the substrate of the metal electrode; and in a direction parallel with the substrate, the first protective electrode is extended over the metal electrode to form the groove and the second portion of the cathode layer is in contact with a side wall of the metal electrode; and the auxiliary electrode layer further comprises a second protective electrode disposed at a side of the metal electrode closer to the substrate; in the direction parallel with the substrate, the second protective electrode is extended over the metal electrode to form the groove, and the second portion of the cathode layer is disposed in the groove and is in contact with the second protective electrode.

* * * * *